(12) United States Patent
Lou et al.

(10) Patent No.: US 11,984,877 B2
(45) Date of Patent: May 14, 2024

(54) LOAD SWITCH APPARATUS AND CONTROL METHOD

(71) Applicant: Xi'an M3 semiconductor INC, Xian (CN)

(72) Inventors: Nuo Lou, Xian (CN); Bo Yang, Allen, TX (US); Xiaoyu Xi, Dallas, TX (US); David Meng, Los Altos, CA (US)

(73) Assignee: Xi'an M3 Semiconductor Inc., Xian (CN)

( * ) Notice: Subject to any disclaimer, the term of this patent is extended or adjusted under 35 U.S.C. 154(b) by 0 days.

(21) Appl. No.: 17/397,001

(22) Filed: Aug. 9, 2021

(65) Prior Publication Data
US 2023/0027110 A1 Jan. 26, 2023

(30) Foreign Application Priority Data

Jul. 23, 2021 (CN) .......................... 202110838236.2

(51) Int. Cl.
H03K 17/0812 (2006.01)

(52) U.S. Cl.
CPC .................. *H03K 17/08122* (2013.01); *H03K 2217/0081* (2013.01)

(58) Field of Classification Search
CPC .................. H03K 17/08122; H03K 2217/0081
See application file for complete search history.

(56) References Cited

U.S. PATENT DOCUMENTS

| 5,495,198 | A | * | 2/1996 | Chen | H03K 17/08122 327/309 |
| 6,459,321 | B1 | * | 10/2002 | Belch | H03K 17/0822 327/323 |
| 7,924,084 | B2 | * | 4/2011 | Kojima | H03K 17/0822 323/364 |
| 9,136,833 | B2 | * | 9/2015 | Hayasaka | H03K 17/063 |
| 10,284,074 | B2 | * | 5/2019 | Wan | H03K 17/063 |
| 2004/0108521 | A1 | * | 6/2004 | Lim | H03K 3/0315 257/200 |
| 2006/0038584 | A1 | * | 2/2006 | Mitsuda | H03K 17/0822 326/33 |

* cited by examiner

Primary Examiner — Ryan Johnson
Assistant Examiner — Colleen J O Toole
(74) Attorney, Agent, or Firm — AP3 Law Firm, PLLC

(57) ABSTRACT

An apparatus includes a transistor coupled to a load through an output terminal of a load switch IC, a gate drive circuit connected to a gate of the transistor, wherein the gate drive circuit is configured such that in a short circuit event, a voltage on the gate of the transistor is gradually reduced, and wherein as a result of reducing the voltage on the gate of the transistor gradually, a negative voltage occurring at the output terminal of the load switch IC is minimized.

12 Claims, 10 Drawing Sheets

US 11,984,877 B2

LOAD SWITCH APPARATUS AND CONTROL METHOD

PRIORITY CLAIM

This application claims priority to Chinese Patent Application No. 202110838236.2, filed on Jul. 23, 2021, which is hereby incorporated by reference in its entirety.

TECHNICAL FIELD

The present invention relates to a gate drive circuit and control method for a load switch, and, in particular embodiments, to a gate drive circuit and control method for reducing a negative voltage occurring at an output terminal of a load switch integrated circuit during a short circuit event.

BACKGROUND

As technologies further advance, a variety of electronic devices, such as mobile phones, tablet PCs, digital cameras, MP3 players and/or the like, have become popular. Each electronic device requires a variety of load switches for controlling power flows in the electronic device. Furthermore, load switches are employed to protect the sources and loads from being damaged by abnormal operating conditions such as short circuit, overcurrent, overvoltage, over temperature and the like.

In operation, the load switch is configured to connect a load to a power supply or disconnect the load from the power supply. The load switch may be controlled by an external signal. When the load switch is turned off, the load switch is able to block current from flowing from the power supply to the load. On the other hand, when the load switch is turned on, a conductive path is established between the load and the power supply. The output voltage is approximately equal to the input voltage of the load switch. The load switch may be implemented a discrete switch such as a metal-oxide-semiconductor field-effect transistor (MOSFET). Alternatively, the load switch may be implemented as a fully integrated IC load switch.

FIG. 1 illustrates a schematic diagram of a system including a load switch integrated circuit (IC). The load switch IC is coupled between a power source (not shown) and a load RL. The input terminal of the load switch IC is coupled to the power source. The output terminal is coupled to the load RL. In order to have a steady input voltage, an input capacitor Cm is coupled between the input terminal of the load switch IC and ground. Likewise, in order to have a steady output voltage, an output capacitor $C_{OUT}$ is coupled between the output terminal of the load switch IC and ground. The trace between the output terminal of the load switch IC and the load RL has parasitic inductance. The parasitic inductance can be denoted as L as shown in FIG. 1. L may be alternatively referred to as a parasitic inductor.

As shown in FIG. 1, the load switch IC includes a switch and an ESD diode. The switch is a transistor. The transistor is an n-type MOSFET. The drain of the n-type MOSFET is coupled to the input terminal of the load switch IC. The source of the n-type MOSFET is coupled to the output terminal of the load switch IC. The gate of the n-type MOSFET is controlled by a gate drive circuit. The load switch IC may further comprise an electrostatic discharge (ESD) diode. The cathode of the ESD diode is coupled to the output terminal of the load switch IC. The anode of the ESD diode is coupled to ground.

As shown in FIG. 1, the current flowing into the load switch IC is denoted by $I_{IN}$. The voltage on the input terminal of the load switch IC is denoted by $V_{IN}$. The current flowing through the transistor of the load switch IC is denoted by $I_{OUT}$. The current flowing through the ESD diode is denoted by $I_{BD}$. The voltage on the output terminal of the load switch IC is denoted by $V_{OUT}$. The current flowing through the output capacitor is denoted by $I_{COUT}$. The current flowing through the parasitic inductor is denoted by $I_{LOAD}$. The voltage across the two terminals of the load RL is denoted by $V_{LOAD}$.

In operation, when a short circuit event occurs at the load RL, the output voltage $V_{OUT}$ drops in response to the short circuit event. The load switch IC detects the voltage change at the output terminal. In response to this voltage change, the gate drive circuit turns off the transistor so as to protect the load switch IC from being damaged during the short circuit event.

FIG. 2 illustrates various waveforms associated with the load switch IC shown in FIG. 1. The horizontal axis of FIG. 2 represents intervals of time. There are six rows. The first row represents the voltage ($V_{LOAD}$) across the two terminals of the load RL. The second row represents the voltage ($V_{OUT}$) at the output terminal of the load switch IC. The third row represents the current ($I_{OUT}$) flowing through the transistor of the load switch IC. The fourth row represents the current ($I_{COUT}$) flowing through the output capacitor of the load switch IC. The fifth row represents the current ($I_{LOUT}$) flowing through the parasitic inductor coupled between the output terminal of the load switch IC and the load RL. The sixth row represents the current ($I_{BD}$) flowing through the ESD diode of the load switch IC.

In operation, when a short circuit occurs at t1, the voltage ($V_{LOAD}$)) across the two terminals of the load RL drops quickly to zero as shown in FIG. 2. In response to this short circuit, the current ($I_{OUT}$) flowing through the transistor of the load switch and the current ($I_{LOAD}$) flowing through the parasitic inductor increases in a linear manner from t1 to t2. During the same time period, the gate drive circuit is configured to turn off the transistor of the load switch IC. At t2, the current ($I_{OUT}$) flowing through the transistor of the load switch reaches its peak (ILIMT).

After t2, the gate voltage of the transistor of the load switch IC is discharged to zero quickly. From t2 to t3, the current ($I_{COUT}$) flowing through the output capacitor discharges the energy stored in the output capacitor. At the same time, the current ($I_{OUT}$) flowing through the transistor of the load switch IC starts to decrease from t2. The output capacitor cannot be replenished. The voltage ($V_{OUT}$) at the output terminal of the load switch IC starts to decrease from t2.

At t3, the current ($I_{LOAD}$) flowing through the parasitic inductor reaches its peak value. At the same time, the voltage ($V_{OUT}$) at the output terminal of the load switch IC is approximately equal to zero.

After t3, the voltage ($V_{OUT}$) at the output terminal of the load switch IC starts to have a negative value. The current ($I_{LOAD}$) flowing through the parasitic inductor starts to decrease as shown in FIG. 2. The voltage ($V_{OUT}$) at the output terminal of the load switch IC starts to have a negative value. Because of the ESD diode, $V_{OUT}$ will be clamped by this diode voltage once it goes to negative. After the parasitic inductor current has been reset by the clamped output voltage, the voltage ($V_{OUT}$) at the output terminal of the load switch IC changes from its negative peak back to zero.

As shown in FIG. 2, after a short circuit occurs, $V_{OUT}$ drops quickly to zero. A large current flows through the parasitic inductor L. The large current flowing through L causes a negative voltage on the output terminal of the load switch IC. Various circuits (e.g., ESD diode) are coupled to the output terminal of the load switch IC. When the negative voltage exceeds the threshold voltage (e.g., −0.7 V) of the ESD diode, a large current may flow into the load switch IC. Such a large current may cause a circuit malfunction or failure. It would be desirable to have a gate drive circuit and control method for reducing the negative voltage on the output terminal of the load switch IC, thus reduce the negative current going through the ESD diode so as to have a reliable load switch IC.

SUMMARY

In accordance with an embodiment, an apparatus comprises a transistor coupled to a load through an output terminal of a load switch integrated circuit (IC), a gate drive circuit connected to a gate of the transistor, wherein the gate drive circuit is configured such that in a short circuit event, a voltage on the gate of the transistor is gradually reduced, and wherein as a result of reducing the voltage on the gate of the transistor gradually, a negative voltage occurring at the output terminal of the load switch IC is minimized.

In accordance with another embodiment, a method comprises configuring a transistor as a load switch, wherein a first drain/source terminal of the transistor is coupled to a power source through an input terminal of a load switch IC, and a second drain/source terminal of the transistor is coupled to a load through an output terminal of the load switch IC, and during a short circuit event, gradually reducing a gate voltage of the transistor so as to minimize a negative voltage occurring at the output terminal of the load switch IC.

In accordance with yet another embodiment, a method comprises providing a gate drive circuit to control a gate of a load switch coupled between a power source and a load, during a short circuit event, clamping a gate voltage of the load switch at a voltage level approximately equal to two times a voltage drop across a diode, and after the gate voltage of the load switch has been clamped, discharging the gate voltage of the load switch to zero in a controllable manner using a current source.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a gate drive circuit and control method for a load switch IC. The invention may also be applied, however, to a variety of integrated circuits. Hereinafter, various embodiments will be explained in detail with reference to the accompanying drawings.

Figure 3:
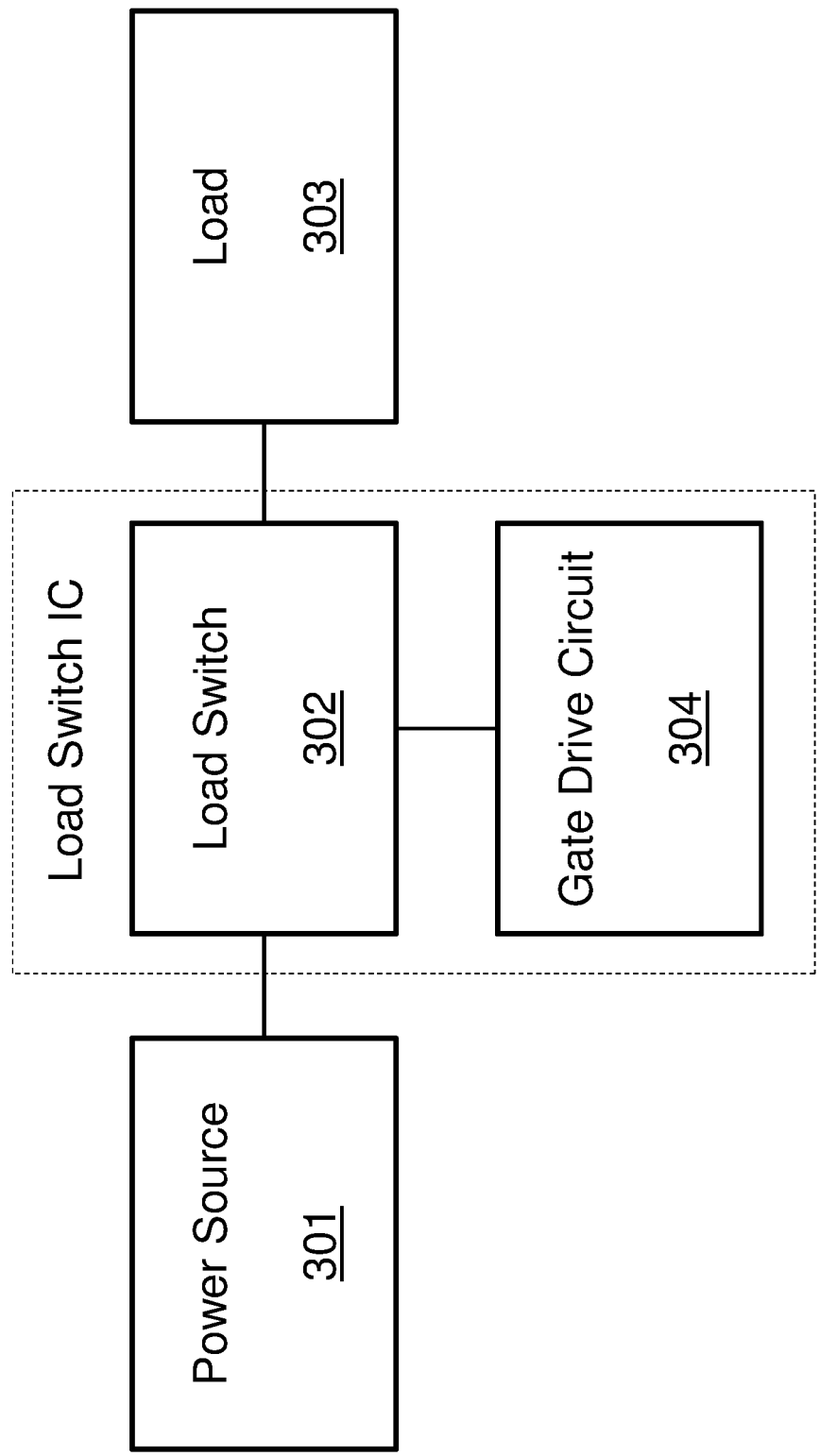
FIG. 3 illustrates a block diagram of a system including a load switch IC in accordance with various embodiments of the present disclosure.

FIG. 3 illustrates a block diagram of a system including a load switch IC in accordance with various embodiments of the present disclosure. The load switch IC is coupled between a power source 301 and a load 303. The input terminal of the load switch IC is coupled to the power source 301. The output terminal is coupled to the load 303. In order to have a steady input voltage, an input capacitor is coupled between the input terminal of the load switch IC and ground. Likewise, in order to have a steady output voltage, an output capacitor is coupled between the output terminal of the load switch IC and ground.

In some embodiments, the load switch IC comprises a transistor configured as a load switch. In some embodiments, the transistor is an n-type MOSFET. The drain of the n-type MOSFET is coupled to the input terminal of the load switch IC. The source of the n-type MOSFET is coupled to the output terminal of the load switch IC. The gate of the n-type MOSFET is controlled by a gate drive circuit.

The gate drive circuit is configured to turn off the load switch in response to an abnormal event occurring inside and outside the load switch IC. In particular, the gate drive circuit is configured such that in a short circuit event, a voltage on the gate of the load switch is gradually reduced. As a result of reducing the voltage on the gate gradually, a negative voltage occurring at the output terminal of the load switch IC is minimized. The detailed structure and operating principle of the gate drive circuit will be described below with respect to FIGS. 3-8.

In some embodiments, the load switch may be implemented as any other suitable semiconductor devices such as bipolar junction transistor (BJT) devices, super junction transistor (SJT) devices, insulated gate bipolar transistor (IGBT) devices, gallium nitride (GaN) based power devices and/or the like.

Figure 4:
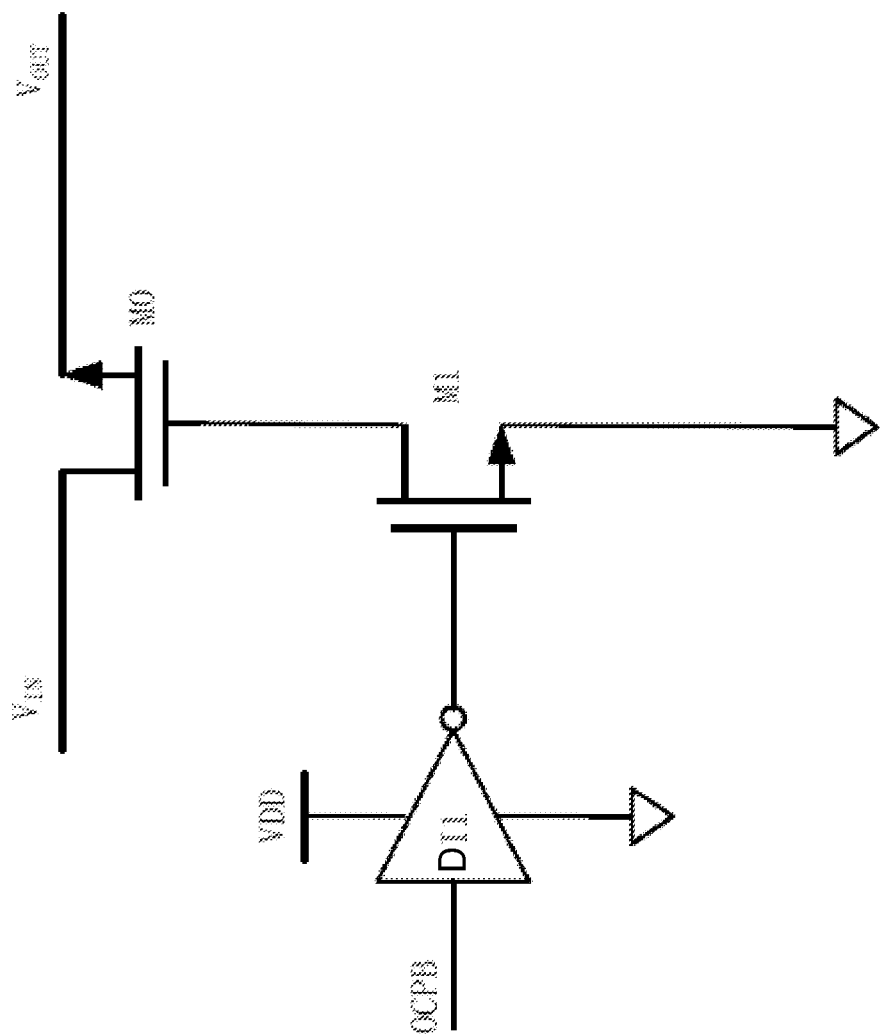
FIG. 4 illustrates a schematic diagram of a first implementation of the load switch IC shown in FIG. 3 in accordance with various embodiments of the present disclosure.

FIG. 4 illustrates a schematic diagram of a first implementation of the load switch IC shown in FIG. 3 in accordance with various embodiments of the present disclosure. The load switch IC comprises a transistor M0. Transistor M0 is an n-type MOSFET. As shown in FIG. 4, M0 is coupled between an input terminal $V_{IN}$ and an output terminal $V_{OUT}$.

The gate drive circuit comprises an auxiliary switch M1 and a driver DI1. As shown in FIG. 4, a drain of the auxiliary switch M1 is connected to the gate of the transistor M0. A source of the auxiliary switch is connected to ground. The output of the driver DI1 is connected to a gate of the auxiliary switch M1.

In a short circuit event, the control signal OCPB is configured to turn on the auxiliary switch M1 through the driver DI1. The turned on M1 is able to turn off M0 to protect the load switch IC during the short circuit event. In the process of turning on M1, a bias voltage VDD of the driver is adjusted so as to change the turn-on impedance of the auxiliary switch M1. The turn-on impedance of the auxiliary switch M1 is adjusted such that the turn-off process of M0 has several different turn-off speeds in response to different turn-off stages of M0. The different turn-off speeds help to control the current downward slope of $I_{LOAD}$. A slow downward slope of $I_{LOAD}$ helps to minimize the negative voltage occurring at the output terminal of the load switch IC.

Figure 5:
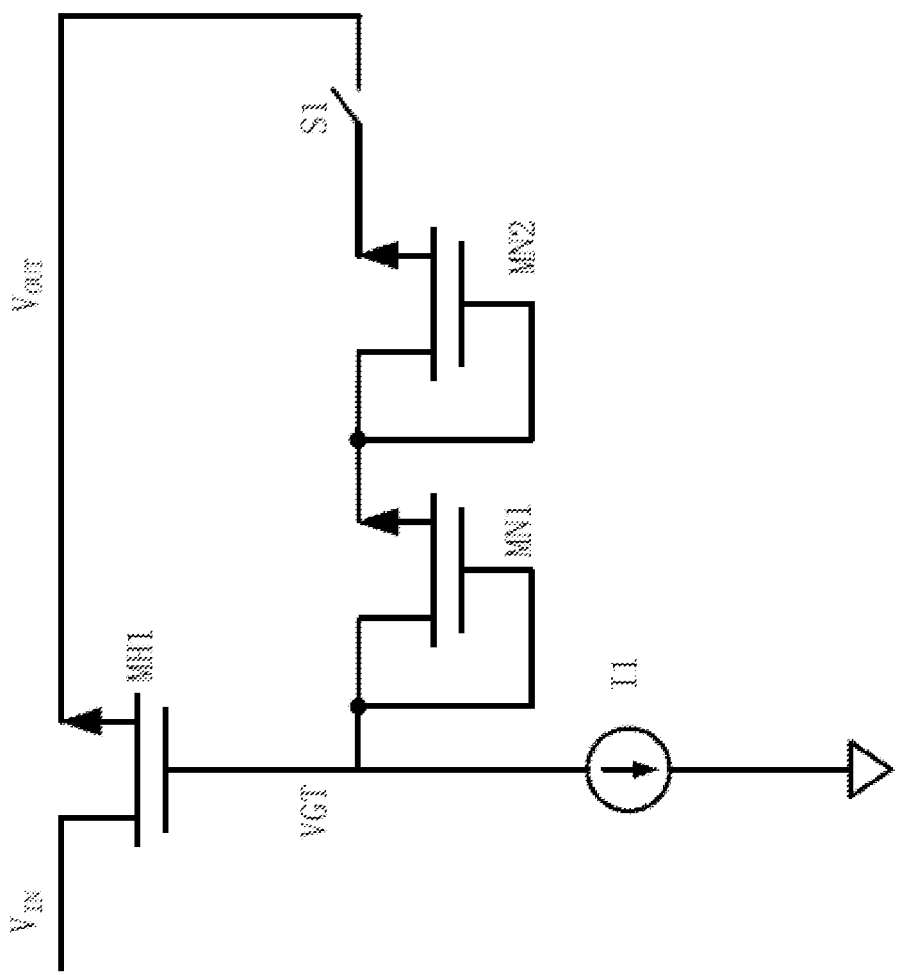
FIG. 5 illustrates a schematic diagram of a second implementation of the load switch IC shown in FIG. 3 in accordance with various embodiments of the present disclosure.

FIG. 5 illustrates a schematic diagram of a second implementation of the load switch IC shown in FIG. 3 in accordance with various embodiments of the present disclosure. The load switch IC comprises a transistor MH1. Transistor MH1 is an n-type MOSFET. As shown in FIG. 5, MH1 is coupled between an input terminal $V_{IN}$ and an output terminal $V_{OUT}$.

The gate drive circuit comprises a first diode-connected n-type transistor MN1, a second diode-connected n-type transistor MN2, a first switch S1 and a first current source I1. The first diode-connected n-type transistor MN1, the second diode-connected n-type transistor MN2 and the first switch S1 are connected in series between the gate of the transistor MH1 and the output terminal of the load switch IC. The first current source is connected between the gate of the transistor MH1 and ground.

During the short circuit event, the first switch S1 is configured to be turned on to clamp a gate-to-source voltage of the transistor MH1 at a predetermined voltage. After the gate-to-source voltage of the transistor MH1 has been clamped at the predetermined voltage, the first current source I1 is configured to discharge the gate of the transistor MH1 in a controllable manner from the predetermined voltage to zero. In some embodiments, the predetermined voltage is equal to two times a voltage drop across a diode. In alternative embodiments, the predetermined voltage is equal to two times a threshold voltage of the transistor.

In the short circuit event, a voltage on the gate of the transistor MH1 is gradually reduced. As a result of reducing the voltage on the gate gradually, a negative voltage occurring at the output terminal of the load switch IC is minimized.

Figure 6:
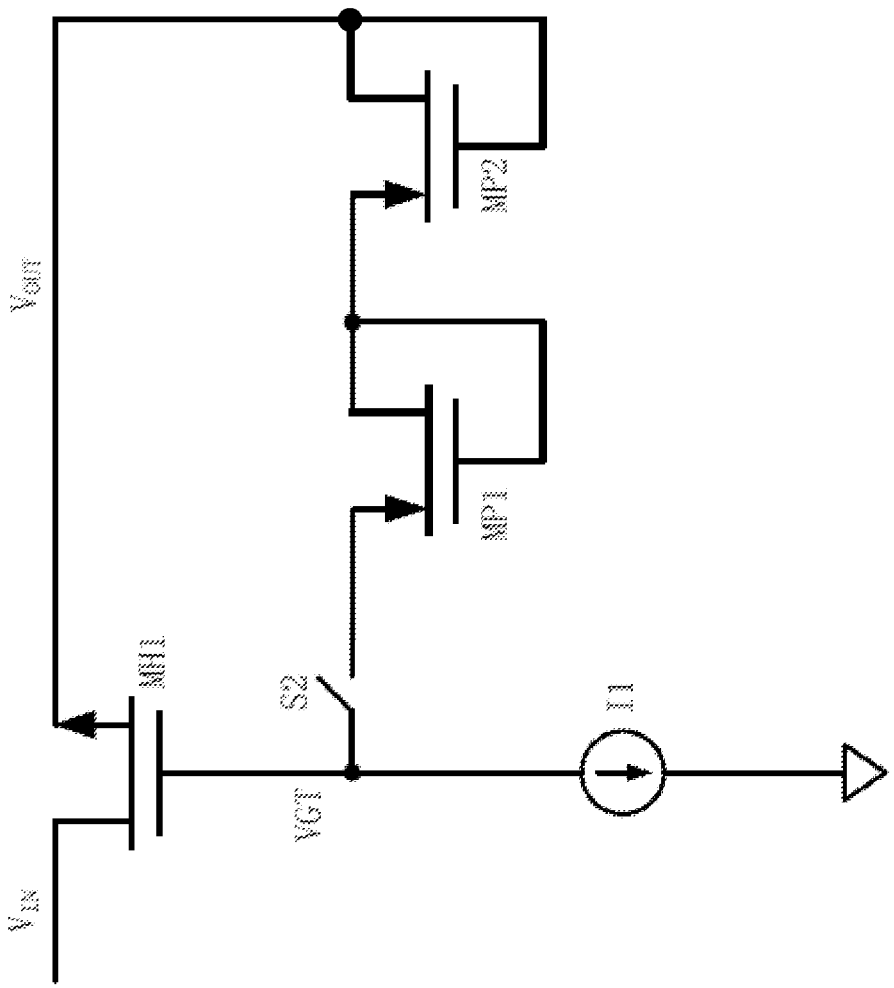
FIG. 6 illustrates a schematic diagram of a third implementation of the load switch IC shown in FIG. 3 in accordance with various embodiments of the present disclosure.

FIG. 6 illustrates a schematic diagram of a third implementation of the load switch IC shown in FIG. 3 in accordance with various embodiments of the present disclosure. The structure and operating principle of the gate drive circuit shown in FIG. 6 is similar to that shown in FIG. 5 except that the diode-connected transistors MP1 and MP2 are p-type transistors, and hence are not discussed herein again to avoid repetition.

Figure 7:
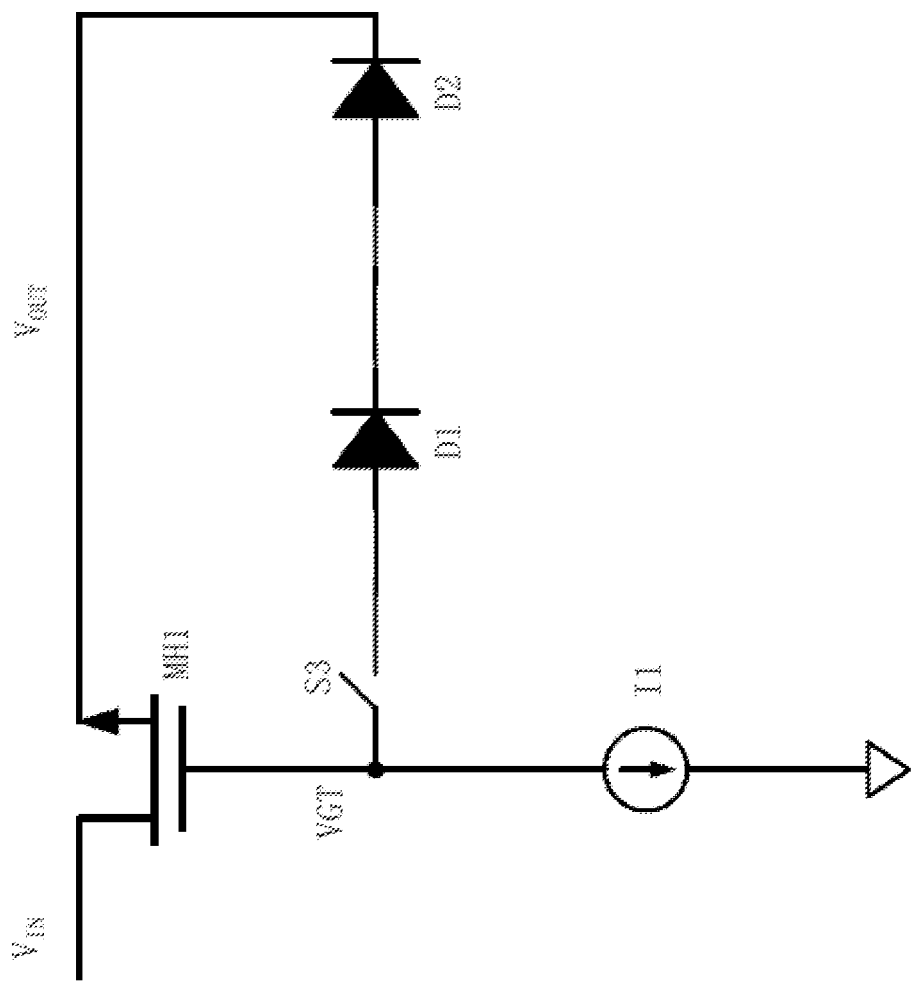
FIG. 7 illustrates a schematic diagram of a fourth implementation of the load switch IC shown in FIG. 3 in accordance with various embodiments of the present disclosure.

FIG. 7 illustrates a schematic diagram of a fourth implementation of the load switch IC shown in FIG. 3 in accordance with various embodiments of the present disclosure. The structure of the gate drive circuit shown in FIG. 7 is similar to that shown in FIG. 5 except that the diode-connected transistors are replaced by didoes D1 and D2. The operating principle of the gate drive circuit is similar to that of the gate drive circuit discussed above with respect to FIG. 5, and hence is not discussed herein again to avoid repetition.

Figure 8:
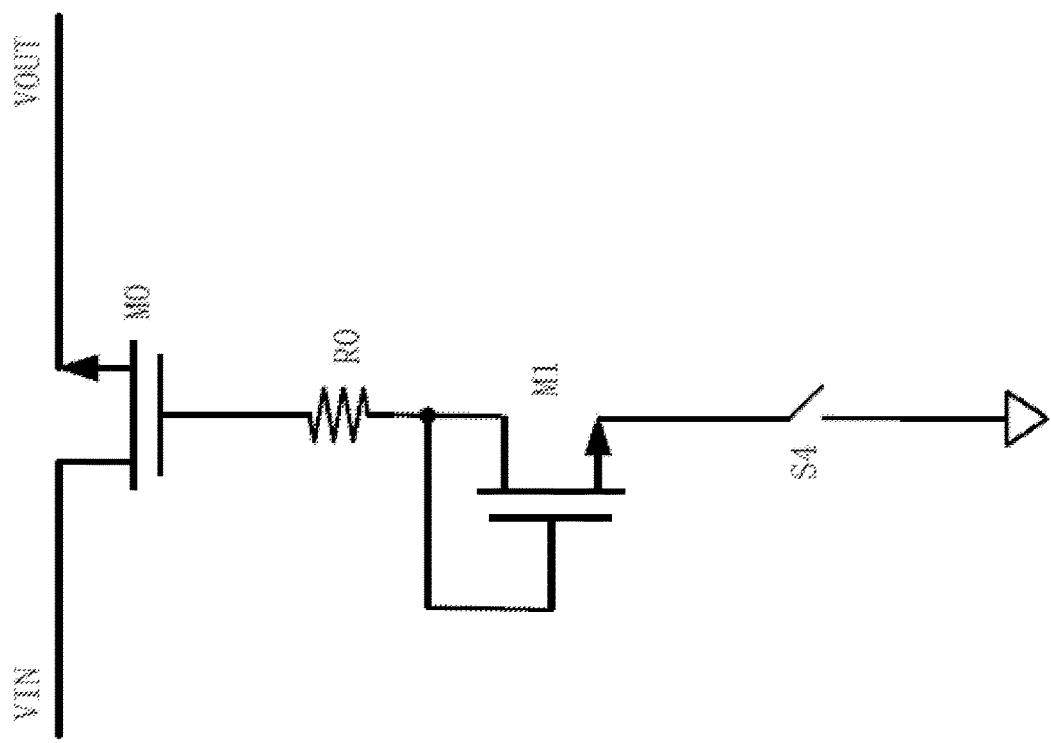
FIG. 8 illustrates a schematic diagram of a fifth implementation of the load switch IC shown in FIG. 3 in accordance with various embodiments of the present disclosure.

FIG. 8 illustrates a schematic diagram of a fifth implementation of the load switch IC shown in FIG. 3 in accordance with various embodiments of the present disclosure. The load switch IC comprises a transistor M0. Transistor M0 is an n-type MOSFET. As shown in FIG. 8, M0 is coupled between an input terminal $V_{IN}$ and an output terminal $V_{OUT}$.

The gate drive circuit comprises a diode-connected auxiliary transistor M1, a resistor RO and a fourth switch S4. The resistor, the diode-connected auxiliary transistor M1 and the fourth switch S4 are connected in series between the gate of the transistor M0 and ground.

During the short circuit event, the fourth switch S4 is configured to be turned on. The diode-connected auxiliary transistor M1 and the resistor RO are configured to discharge the gate of the transistor M0 in a controllable manner to zero.

In the short circuit event, the voltage on the gate of the transistor M0 is gradually reduced to zero. As a result of reducing the voltage on the gate gradually, a negative voltage occurring at the output terminal of the load switch IC is minimized.

In FIGS. 5-8, in response to a short circuit, the operation of the gate drive circuit can be divided into two stages. In a first stage, the switches S1 (FIG. 5), S2 (FIG. 6), S3 (FIG. 7) and S4 (FIG. 8) are turned on. The gate-to-source voltage of the transistor inside the load switch IC is clamped to a predetermined voltage. In some embodiments, the predetermined voltage is equal to two times a threshold voltage of the transistor. In alternative embodiments, the predetermined voltage is equal to two times a voltage drop across a diode. After the gate-to-source voltage of the transistor has been clamped to the predetermined voltage, the current flowing through the transistor is limited by the clamped gate-to-source voltage of the transistor. In a second stage, after the gate-to-source voltage of the transistor has been clamped to the predetermined voltage, a small current source (e.g., I1 shown in FIG. 5) is employed to discharge the gate voltage gradually to zero. The transistor of the load switch IC is fully turned off accordingly.

In the first stage described above, the gate-to-source voltage of the transistor is quickly clamped to the predetermined voltage so as to limit the current flowing through the load switch IC under the short circuit. In the second stage described above, the gate-to-source voltage of the transistor is gradually reduced from the predetermined voltage to zero. Such a gradually reduced gate-to-source voltage helps to achieve a slow downward slope of the current flowing through the parasitic inductor, thereby minimizing the negative voltage on the output terminal of the load switch IC.

Figure 9:
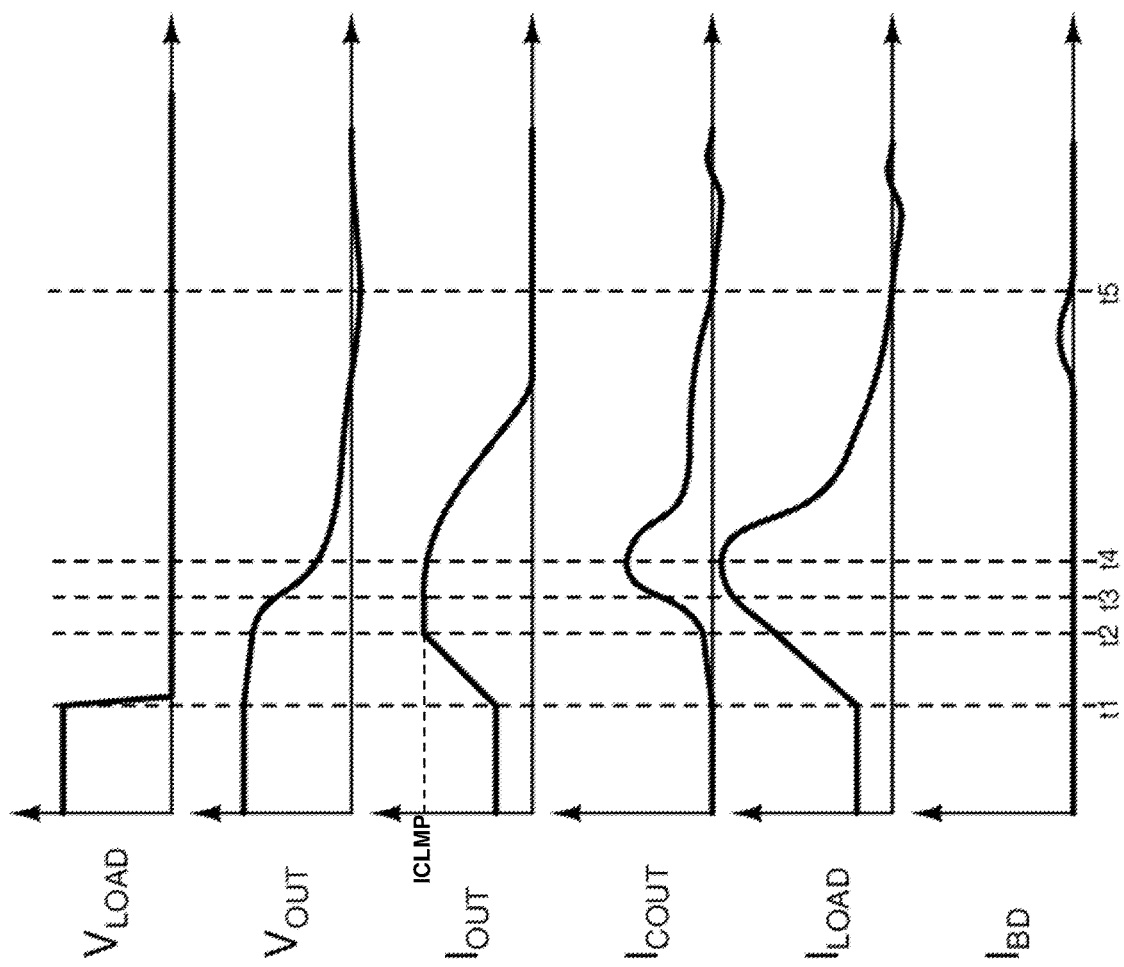
FIG. 9 illustrates various waveforms associated with the load switch and the gate drive circuit shown in FIG. 3 in accordance with various embodiments of the present disclosure.

FIG. 9 illustrates various waveforms associated with the load switch and the gate drive circuit shown in FIG. 3 in accordance with various embodiments of the present disclosure. The horizontal axis of FIG. 9 represents intervals of time. There are six rows. The first row represents the voltage ($V_{LOAD}$) across the two terminals of the load RL. The second row represents the voltage ($V_{OUT}$) at the output terminal of the load switch IC. The third row represents the current ($I_{OUT}$) flowing through the transistor of the load switch IC. The fourth row represents the current ($I_{COUT}$) flowing through the output capacitor of the load switch IC. The fifth row represents the current ($I_{LOUT}$) flowing through the parasitic inductor coupled between the output terminal of the load switch IC and the load RL. The sixth row represents the current ($I_{BD}$) flowing through the ESD diode of the load switch IC.

In operation, when a short circuit occurs at t1, the voltage ($V_{LOAD}$) across the two terminals of the load RL drops quickly to zero as shown in FIG. 9. In response to this short circuit, the current ($I_{OUT}$) flowing through the transistor of the load switch IC and the current ($I_{LOAD}$) flowing through the parasitic inductor increases in a linear manner from t1 to t2. During the same time period, the gate drive circuit is configured to gradually reduce a gate voltage of the transistor of the load switch IC. In particular, the gate voltage of the transistor is clamped to a voltage level approximately equal to a predetermined voltage (e.g., two times a voltage drop across a diode).

As shown in FIG. 9, from t2 to t3, the current ($I_{OUT}$) flowing through the transistor of the load switch IC is clamped to a predetermined current value (ICLMP). After the current ($I_{OUT}$) flowing through the transistor of the load switch IC has been clamped to ICLMP, the current ($I_{COUT}$) flowing through the output capacitor starts to increase to meet the current demand of the load ($I_{LOAD}$).

After t2, the gate voltage of the transistor of the load switch IC is gradually discharged to zero. The current ($I_{COUT}$) flowing through the output capacitor discharges the energy stored in the output capacitor. At the same time, the current ($I_{OUT}$) flowing through the transistor of the load switch IC stays at ICLMP from t2 to t3 and starts to decrease from t3. The reduced $I_{OUT}$ indicates less energy is provided for the output capacitor. In other words, the output capacitor cannot be replenished. As shown in FIG. 9, the voltage ($V_{OUT}$) at the output terminal of the load switch decreases from t2.

At t4, both the current ($I_{LOAD}$) flowing through the parasitic inductor and the current ($I_{COUT}$) flowing through the output capacitor reach their respective peak values.

After t4, the voltage ($V_{OUT}$) at the output terminal of the load switch keeps decreasing and starts to have a negative value as shown in FIG. 9. After t4, both the current ($I_{LOAD}$) flowing through the parasitic inductor and the current ($I_{COUT}$) flowing through the output capacitor start to decrease as shown in FIG. 9. At t5, the voltage ($V_{OUT}$) at the output terminal of the load switch IC reaches its negative peak value. The current ($I_{COUT}$) flowing through the output capacitor is approximately equal to zero.

As shown in FIG. 9, prior to t5, the current ($I_{BD}$) flowing through the ESD diode starts to increase and falls back to zero at t5. After t5, the current ($I_{COUT}$) flowing through the output capacitor has a negative value as shown in FIG. 9. After a resonant process between the parasitic inductor and the output capacitor, the current ($I_{COUT}$) flowing through the output capacitor falls back to zero. Likewise, during the resonant process, the voltage ($V_{OUT}$) at the output terminal of the load switch IC changes from its negative peak back to zero.

Figure 1:
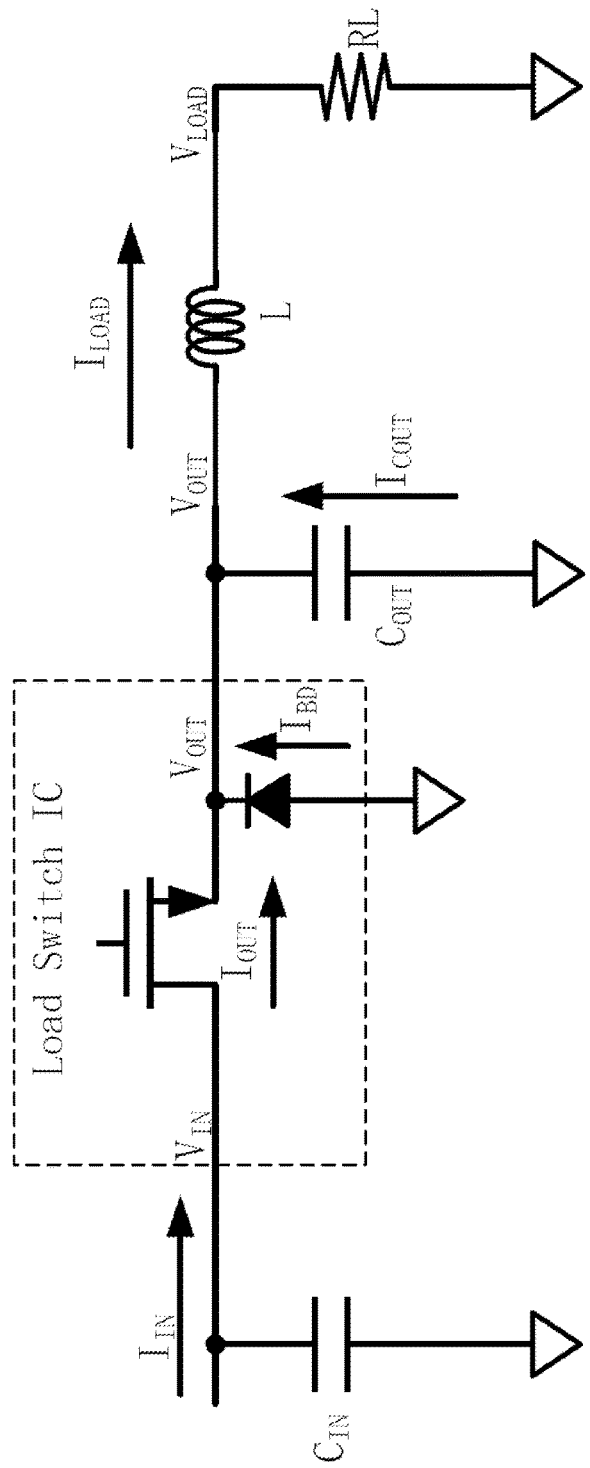
FIG. 1 illustrates a schematic diagram of a system including a load switch IC.
Figure 2:
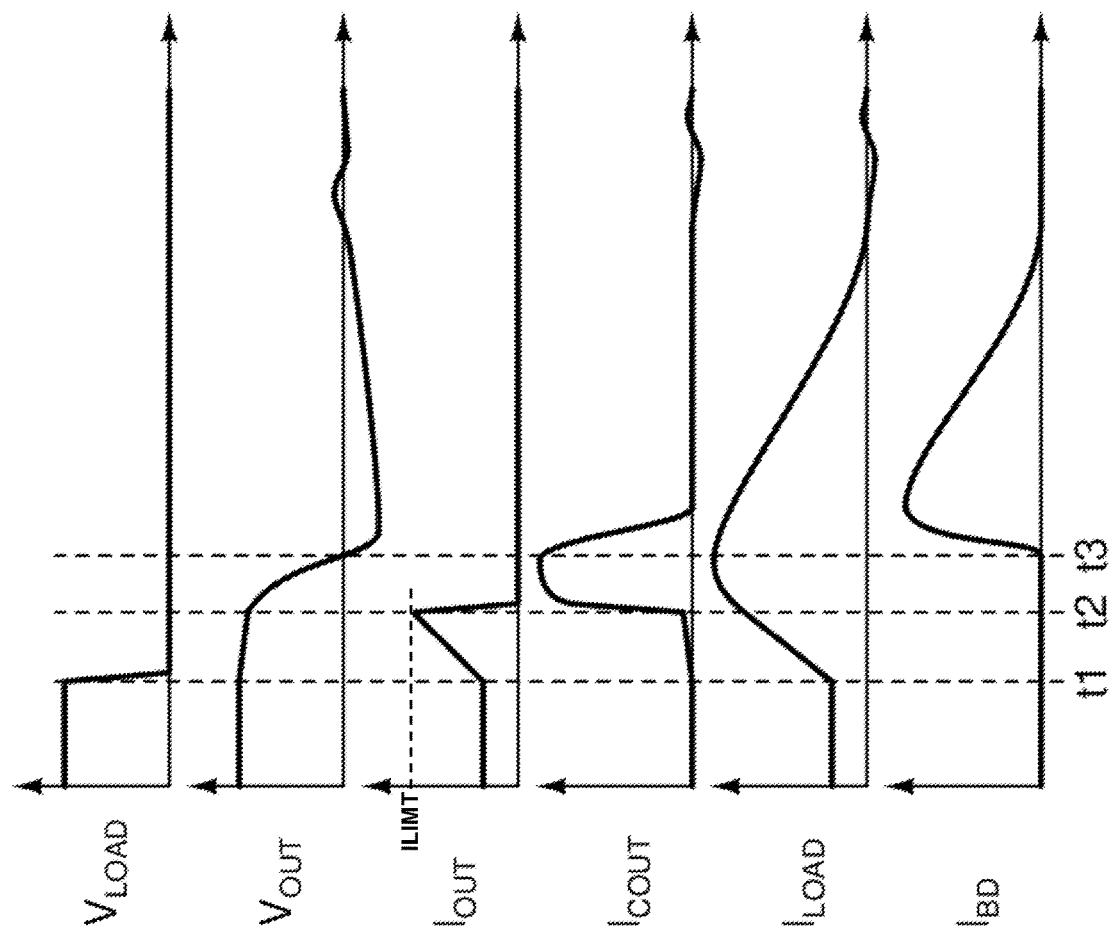
FIG. 2 illustrates various waveforms associated with the load switch IC shown in FIG. 1.

In comparison with FIG. 2, the current ($I_{OUT}$) flowing through the transistor of the load switch has a slow downward slope. As shown in FIG. 9, at t4, when the current ($I_{LOAD}$) flowing through the parasitic inductor reaches its peak value, the majority of $I_{LOAD}$ is provided by $I_{OUT}$. As such, the downward slope of $I_{LOAD}$ is determined by the downward slope of $I_{OUT}$. Since $I_{OUT}$ has a slow downward slope, the voltage difference across the parasitic inductor is reduced accordingly. After the voltage difference across the parasitic inductor has been reduced, the current ($I_{BD}$) flowing through the ESD diode is reduced too. In addition, the negative voltage on the output terminal of the load switch IC is minimized.

Figure 10:
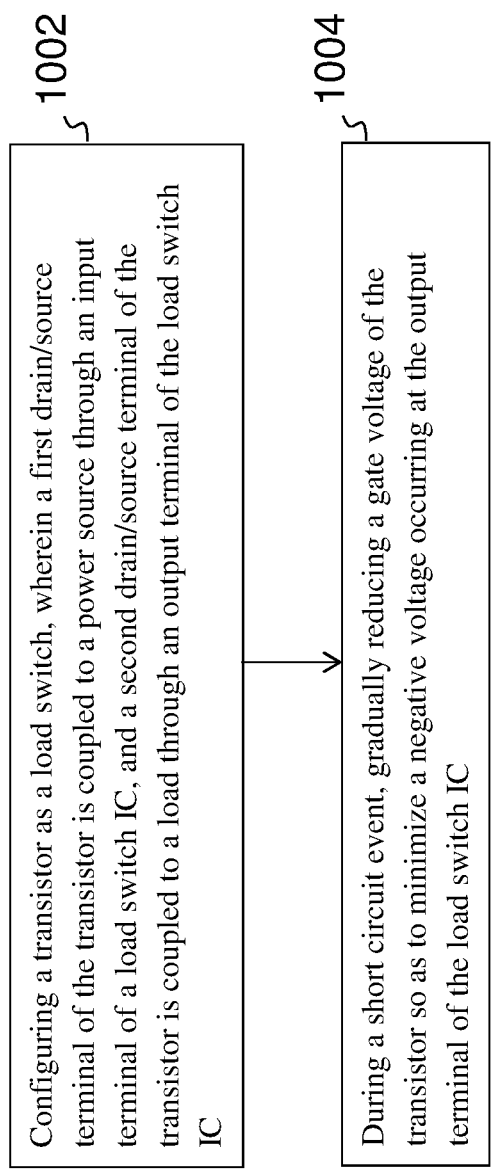
FIG. 10 illustrates a flow chart of a method for controlling the load switch shown in FIG. 3 in accordance with various embodiments of the present disclosure.

FIG. 10 illustrates a flow chart of a method for controlling the load switch shown in FIG. 3 in accordance with various embodiments of the present disclosure. This flowchart shown in FIG. 10 is merely an example, which should not unduly limit the scope of the claims. One of ordinary skill in the art would recognize many variations, alternatives, and modifications. For example, various steps illustrated in FIG. 10 may be added, removed, replaced, rearranged and repeated.

A load switch IC comprises a transistor coupled between a power source and a load. The transistor is an n-type MOSFET. The load switch IC further comprises a gate drive circuit configured to control the operation of the transistor.

At step 1002, the transistor is configured as a load switch. A first drain/source terminal of the transistor is coupled to the power source through an input terminal of the load switch IC. A second drain/source terminal of the transistor is coupled to the load through an output terminal of the load switch IC.

At step 1004, during a short circuit event, the gate drive circuit is configured to gradually reduce the gate voltage of the transistor so as to minimize a negative voltage occurring at the output terminal of the load switch IC.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to

What is claimed is:

1. An apparatus comprising:
   a transistor coupled to a load through an output terminal of a load switch integrated circuit (IC); and
   a gate drive circuit connected to a gate of the transistor, wherein the gate drive circuit comprises two discharge paths having different discharge speeds, and wherein a first discharge path comprises a first current source directly connected between the gate of the transistor and ground, and a second discharge path comprises a first diode-connected n-type transistor, a second diode-connected n-type transistor and a first switch connected in series, and wherein an anode of the first diode-connected n-type transistor is directly connected to the gate of the transistor, a cathode of the second diode-connected n-type transistor is directly connected to a first terminal of the first switch, and a second terminal of the first switch is directly connected to a drain/source terminal of the transistor, and wherein the gate drive circuit is configured such that in a short circuit event, a gate-to-source voltage of the transistor is reduced quickly to a predetermined voltage by the second discharge path, and after the gate-to-source voltage has been clamped to the predetermined voltage, a voltage on the gate of the transistor is gradually reduced by the first current source, and wherein as a result of reducing the voltage on the gate of the transistor gradually, a negative voltage occurring at the output terminal of the load switch IC is minimized.

2. The apparatus of claim 1, wherein:
   the first diode-connected n-type transistor, the second diode-connected n-type transistor and the first switch are connected in series between the gate of the transistor and the output terminal of the load switch IC.

3. The apparatus of claim 2, wherein:
   during the short circuit event, the first switch is configured to be turned on to clamp the gate-to-source voltage of the transistor at the predetermined voltage; and
   after the gate-to-source voltage of the transistor has been clamped at the predetermined voltage, the first current source is configured to discharge the gate of the transistor in a controllable manner from the predetermined voltage to zero.

4. A method comprising:
   configuring a transistor as a load switch, wherein a first drain/source terminal of the transistor is coupled to a power source through an input terminal of a load switch IC, and a second drain/source terminal of the transistor is coupled to a load through an output terminal of the load switch IC; and
   during a short circuit event, clamping, by a clamping circuit, a gate-to-source voltage of the transistor to a predetermined voltage, and after the gate-to-source voltage of the transistor has been clamped to the predetermined voltage, gradually reducing, by a current source, a gate voltage of the transistor from the predetermined voltage to zero so as to minimize a negative voltage occurring at the output terminal of the load switch IC, wherein the clamping circuit forms a first unidirectional conductive path that allows current to flow from a gate of the transistor to a source of the transistor and the current source is a second unidirectional conductive path that allows current to flow from the gate of the transistor to ground, and wherein the first unidirectional conductive path and the second unidirectional conductive path have different discharge speeds.

5. The method of claim 4, further comprising:
   after the gate voltage of the transistor has been clamped at the predetermined voltage, discharging the gate voltage of the transistor to zero in a controllable manner using the current source.

6. The method of claim 5, wherein:
   the predetermined voltage is equal to two times a threshold voltage of the transistor.

7. The method of claim 5, wherein:
   the predetermined voltage is equal to two times a voltage drop across a diode.

8. The method of claim 7, wherein:
   a first diode-connected transistor, a second diode-connected transistor and a switch are used to generate the predetermined voltage, and wherein:
   the first diode-connected transistor, the second diode-connected transistor and the switch are connected in series between the gate of the transistor and the output terminal of the load switch IC.

9. A method comprising:
   providing a gate drive circuit to control a gate of a load switch coupled between a power source and a load, wherein the gate drive circuit comprises two discharge paths having different discharge speeds, and wherein a first discharge path comprises a current source directly connected between the gate of the load switch and ground, and a second discharge path functions as a clamping circuit comprising a first diode-connected n-type transistor, a second diode-connected n-type transistor and a first switch connected in series, and wherein an anode of the first diode-connected n-type transistor is directly connected to the gate of the load switch, a cathode of the second diode-connected n-type transistor is directly connected to a first terminal of the first switch, and a second terminal of the first switch is directly connected to a drain/source terminal of the load switch;
   during a short circuit event, clamping, by the clamping circuit, a gate voltage of the load switch at a voltage level approximately equal to two times a voltage drop across a diode; and
   after the gate voltage of the load switch has been clamped, discharging the gate voltage of the load switch to zero in a controllable manner using the current source.

10. The method of claim 9, wherein:
    the first switch, the first diode-connected n-type transistor and the second diode-connected n-type transistor and are connected in series between the gate of the load switch and a source of the load switch.

11. The method of claim 10, wherein:
    during the short circuit event, the first switch is turned on, and the first diode-connected n-type transistor and the second diode-connected n-type transistor provide a clamping voltage applied to the gate of the load switch to limit a current flowing through the load switch.

12. The method of claim 11, wherein:
    the current source is configured to discharge the gate voltage of the load switch from the clamping voltage to zero in the controllable manner such that a negative voltage occurring at the source of the load switch is minimized.

* * * * *